United States Patent
Sun

(10) Patent No.: US 11,158,799 B2
(45) Date of Patent: Oct. 26, 2021

(54) MASK ASSEMBLY AND METHOD OF PATTERNING SEMICONDUCTOR FILM USING THEREOF

(71) Applicant: WUHAN CHINA STAR OPTOELECTRONICS SEMICONDUCTOR DISPLAY TECHNOLOGY CO., LTD., Wuhan (CN)

(72) Inventor: Pu Sun, Wuhan (CN)

( * ) Notice: Subject to any disclaimer, the term of this patent is extended or adjusted under 35 U.S.C. 154(b) by 372 days.

(21) Appl. No.: 16/325,408

(22) PCT Filed: Jan. 11, 2019

(86) PCT No.: PCT/CN2019/071320
§ 371 (c)(1),
(2) Date: Feb. 14, 2019

(87) PCT Pub. No.: WO2020/118834
PCT Pub. Date: Jun. 18, 2020

(65) Prior Publication Data
US 2021/0184125 A1    Jun. 17, 2021

(30) Foreign Application Priority Data
Dec. 14, 2018 (CN) .......................... 201811535059.5

(51) Int. Cl.
*C23C 14/24* (2006.01)
*H01L 51/00* (2006.01)
(Continued)

(52) U.S. Cl.
CPC ........ *H01L 51/0011* (2013.01); *C23C 14/042* (2013.01); *C23C 14/24* (2013.01);
(Continued)

(58) Field of Classification Search
CPC ... H01L 51/0011; H01L 51/001; H01L 51/56; H01L 2251/50–53; C23C 14/24; C23C 14/042
See application file for complete search history.

(56) References Cited

U.S. PATENT DOCUMENTS 10,903,459 B2 * 1/2021 Kim ..................... H01L 51/56
2017/0222145 A1 * 8/2017 Kim ................... H01L 51/0011
(Continued)

FOREIGN PATENT DOCUMENTS

| CN | 103898441 A | 7/2014 |
|----|-------------|--------|
| CN | 103898442 A | 7/2014 |

(Continued)

*Primary Examiner* — Kyoung Lee
*Assistant Examiner* — Christina A Sylvia

(57) ABSTRACT

A mask assembly and a method of patterning a semiconductor film using the mask assembly. A first mask comprises a plurality of first light shielding regions, a plurality of first light transmissive regions, and at least one first light shielding island; a boundary of a first light shielding island is not connected to a boundary of the first mask; a second mask comprises a plurality of second light shielding regions, a plurality of second light transmissive regions, and at least one second light shielding island; a boundary of the second light shielding island is not connected to a boundary of the second mask; the first light shielding region and the second light shielding region are complementarily arranged, the first light transmissive region and the second light transmissive region are complementarily disposed.

13 Claims, 3 Drawing Sheets

(51) Int. Cl.
*C23C 14/04* (2006.01)
*H01L 51/56* (2006.01)

(52) U.S. Cl.
CPC ............ *H01L 51/001* (2013.01); *H01L 51/56* (2013.01); *H01L 2251/50* (2013.01); *H01L 2251/53* (2013.01)

(56) References Cited

U.S. PATENT DOCUMENTS

| | | | | |
|---|---|---|---|---|
| 2018/0198067 | A1* | 7/2018 | Kim | ............... C23C 16/042 |
| 2020/0283884 | A1* | 9/2020 | Lin | .................. C23C 14/12 |
| 2020/0357998 | A1* | 11/2020 | Bai | .................. C23C 14/24 |
| 2021/0020871 | A1* | 1/2021 | Wang | ............... C23C 14/042 |

FOREIGN PATENT DOCUMENTS

| | | | |
|---|---|---|---|
| CN | 104157550 | A | 11/2014 |
| CN | 104216233 | A | 12/2014 |
| CN | 105448699 | A | 3/2016 |
| CN | 107236927 | A | 10/2017 |
| JP | 2003077654 | A | 3/2003 |

\* cited by examiner

MASK ASSEMBLY AND METHOD OF PATTERNING SEMICONDUCTOR FILM USING THEREOF

CROSS REFERENCE TO RELATED APPLICATION

This application claims the priority of International Application No. PCT/CN2019/071320, filed on 2019 Jan. 11, which claims priority to Chinese Application No. 201811535059.5, filed on 2018 Dec. 14. The entire disclosures of each of the above applications are incorporated herein by reference.

BACKGROUND OF INVENTION

Field of Invention

The present invention relates to the field of display technologies, and in particular, to a mask assembly and a method of patterning a semiconductor film using thereof.

Description of Prior Art

Because organic light emitting diode (OLED) displays do not require a backlight to realize display, they have been widely used. At this stage, in production processes of small and medium-sized OLED panels, evaporation is an important process. In an evaporation process, metal masks are the tools used for pattern definition, which can be divided into fine metal masks and general metal masks. Fine metal masks are used for pixel definition and are mainly used for R, G, B pixel layers and doping material evaporation. General metal masks are used for the definition of a common layer pattern, and are mainly used for material evaporation of electron injection layers, electron hole injection layers, electron transport layers, and electron hole transport layers.

At present, there is a new type of screens similar to "Mediterranean." As shown in FIG. 1, a display screen having a non-display region enclosed by a display region, and the non-display region is usually used to set a camera or other non-display elements.

Technical Problems

Currently, the method of forming a "Mediterranean" display screen is violent cutting. That is, after the display region is completed, display elements of the "Mediterranean" region are removed by laser cutting, and other non-display elements are embedded. However, violent cutting will seriously damage light emitting elements and is difficult to control accurately.

SUMMARY OF INVENTION

The present invention provides a mask assembly and a method of patterning a semiconductor film using thereof, to form a "Mediterranean" display screen in an organic light emitting diode (OLED) display.

In order to solve the above problems, in one aspect, the present invention provides a mask assembly comprising a first mask and a second mask, the first mask and the second mask having a same shape and size, wherein the first mask comprises a plurality of first light shielding regions, a plurality of first light transmissive regions, and at least one first light shielding island; the plurality of first light shielding regions and the first light transmissive regions are parallel to each other and spaced from one another on the first mask; the first light shielding island covers a portion of the first shielding regions and the first light transmissive regions; a boundary of the first light shielding island is not connected to a boundary of the first mask;

the second mask comprises a plurality of second light shielding regions, a plurality of second light transmissive regions, and at least one second light shielding island; the plurality of second light shielding regions and the second light transmissive regions are parallel to each other and spaced from one another on the first mask; a second light shielding island covers a portion of the second shielding regions and the second light transmissive regions; a boundary of the second light shielding island is not connected to a boundary of the second mask; wherein the first light shielding regions and the second light shielding regions are complementarily arranged, the first light transmissive regions and the second light transmissive regions are complementarily disposed; the first light shielding island and the second light shielding island have a same shape, size, and position, and are disposed to overlap each other; wherein the first mask and the second mask are rectangular, the first light shielding regions, the first light transmissive regions, the second light shielding regions and the second light transmissive regions are strip patterns parallel to one side of the first mask and the second mask; the strips have a same shape and size, positions of the first light shielding regions overlap with positions of the second light transmissive regions, positions of the second light shielding regions overlap with positions of the first light transmissive regions.

Wherein, shapes of the first light shielding island and the second light shielding island comprise a circle, an ellipse, a triangle, a rectangle, a polygon, and a heart.

Wherein, the first mask and the second mask are strip-shaped equidistant patterns, the first light shielding regions, the first light transmissive regions, the second light shielding regions and the second light transmissive regions are strip patterns parallel to an axis of symmetry of the first mask and the second mask.

Wherein, a width of the strip patterns is smaller than or equal to 5 μm.

In another aspect, the present invention provides a mask assembly comprising a first mask and a second mask, the first mask and the second mask having a same shape and size, wherein the first mask comprises a plurality of first light shielding regions, a plurality of first light transmissive regions, and at least one first light shielding island; the plurality of first light shielding regions and the first light transmissive regions are parallel to each other and spaced from one another on the first mask; the first light shielding island covers a portion of the first shielding regions and the first light transmissive regions; a boundary of the first light shielding island is not connected to a boundary of the first mask;

the second mask comprises a plurality of second light shielding regions, a plurality of second light transmissive regions, and at least one second light shielding island; the plurality of second light shielding regions and the second light transmissive regions are parallel to each other and spaced from one another on the first mask; the second light shielding island covers a portion of the second shielding regions and the second light transmissive regions; a boundary of the second light shielding island is not connected to a boundary of the second mask; wherein the first light shielding regions and the second light shielding regions are complementarily arranged, the first light transmissive regions and the second light transmissive regions are complementarily disposed; the first light shielding island and the second light shielding island have a same shape, size, and position, and are disposed to overlap each other.

Wherein, shapes of the first light shielding island and the second light shielding island comprise a circle, an ellipse, a triangle, a rectangle, a polygon, and a heart.

Wherein, the first mask and the second mask are strip-shaped equidistant patterns, the first light shielding regions, the first light transmissive regions, the second light shielding regions and the second light transmissive regions are strip patterns parallel to an axis of symmetry of the first mask and the second mask.

Wherein, a width of the strip patterns is smaller than or equal to 5 μm.

Wherein, the first mask and the second mask are rectangular, the first light shielding regions, the first light transmissive regions, the second light shielding regions and the second light transmissive regions are strip patterns parallel to one side of the first mask and the second mask; the strips have a same shape and size, positions of the first light shielding regions overlap with positions of the second light transmissive regions, positions of the second light shielding regions overlap with positions of the first light transmissive regions.

Accordingly, the present invention also provides a method of patterning a semiconductor film using a mask assembly, wherein the mask assembly comprising a first mask and a second mask, the first mask and the second mask having a same shape and size; wherein the method comprises steps of:

transferring a pattern of the first mask onto the semiconductor film; the first mask comprises a plurality of first light shielding regions, a plurality of first light transmissive regions, and at least one first light shielding island; the plurality of first light shielding regions and the first light transmissive regions are parallel to each other and spaced from one another on the first mask; the first light shielding island covers a portion of the first shielding regions and the first light transmissive regions; a boundary of the first light shielding island is not connected to a boundary of the first mask;

transferring a pattern of the second mask onto the semiconductor film; the second mask comprises a plurality of second light shielding regions, a plurality of second light transmissive regions, and at least one second light shielding island; the plurality of second light shielding regions and the second light transmissive regions are parallel to each other and spaced from one another on the first mask; the second light shielding island covers a portion of the second shielding regions and the second light transmissive regions; a boundary of the second light shielding island is not connected to a boundary of the second mask;

the first light shielding regions and the second light shielding regions are complementarily arranged, the first light transmissive regions and the second light transmissive regions are complementarily disposed; the first light shielding island and the second light shielding island have a same shape, size, and position, and are disposed to overlap each other.

Accordingly, the present invention also provides a method of patterning a semiconductor film using a mask assembly according to claim 10, wherein shapes of the first light shielding island and the second light shielding island comprise a circle, an ellipse, a triangle, a rectangle, a polygon, and a heart.

Wherein, the first mask and the second mask are strip-shaped equidistant patterns, the first light shielding regions, the first light transmissive regions, the second light shielding regions and the second light transmissive regions are strip patterns parallel to an axis of symmetry of the first mask and the second mask.

Wherein, a width of the strip patterns is smaller than or equal to 5 μm.

Wherein, the first mask and the second mask are rectangular, the first light shielding regions, the first light transmissive regions, the second light shielding regions and the second light transmissive regions are strip patterns parallel to one side of the first mask and the second mask; the strips have a same shape and size, positions of the first light shielding regions overlap with positions of the second light transmissive regions, positions of the second light shielding regions overlap with positions of the first light transmissive regions.

Beneficial Effect

In the mask assembly provided by the present invention, an overall evaporation of an OLED display region can be achieved by a complementary arrangement of light shielding regions and light transmissive regions, a shielding of a "Mediterranean" non-display region can be achieved by overlapped light shielding islands, thereby laser cutting of the display region is avoided. Since the width of the light shielding regions and the light transmissive regions are smaller than or equal to 5 μm, the height differences of the patterns formed by the two photoetchings can be substantially eliminated. At the same time as the formation of the "Mediterranean" non-display region, the formation of uneven evaporation patterns in the display region is avoided.

DETAILED DESCRIPTION OF PREFERRED EMBODIMENTS

Figure 1:
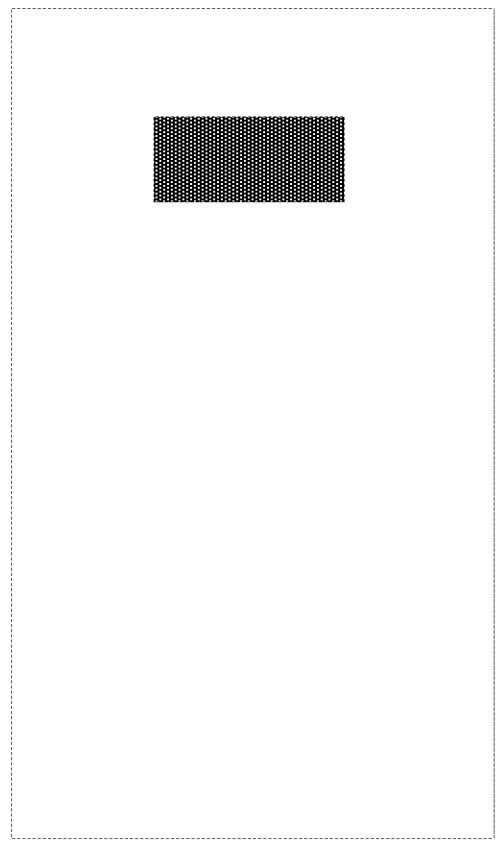
FIG. 1 is a schematic structural diagram of a "Mediterranean" organic light emitting diode (OLED) display screen according to an embodiment of the present invention.

Description of following embodiment, with reference to accompanying drawings, is used to exemplify specific embodiments which may be carried out in the present disclosure. Directional terms mentioned in the present disclosure, such as "top", "bottom", "front", "back", "left", "right", "inside", "outside", "side", etc., are only used with reference to orientation of the accompanying drawings. Therefore, the directional terms are intended to illustrate, but not to limit, the present disclosure. In the drawings, components having similar structures are denoted by same numerals.

The present invention provides a mask assembly and a method of patterning a semiconductor film using thereof to form a "Mediterranean" display screen in an organic light emitting diode (OLED) display. Hereinafter, the present invention will be described in detail with reference to the accompanying drawings.

Figure 2:
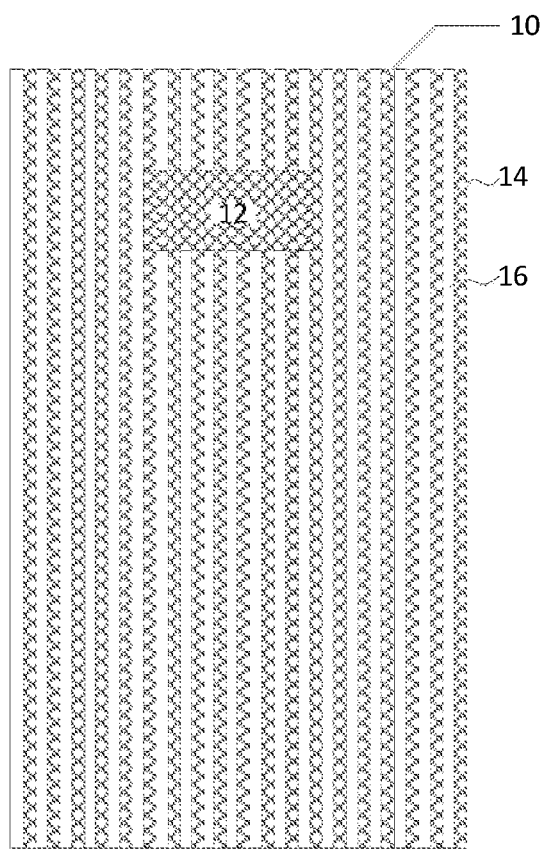
FIG. 2 is a schematic structural diagram of a first mask in an embodiment of the present invention.
Figure 3:
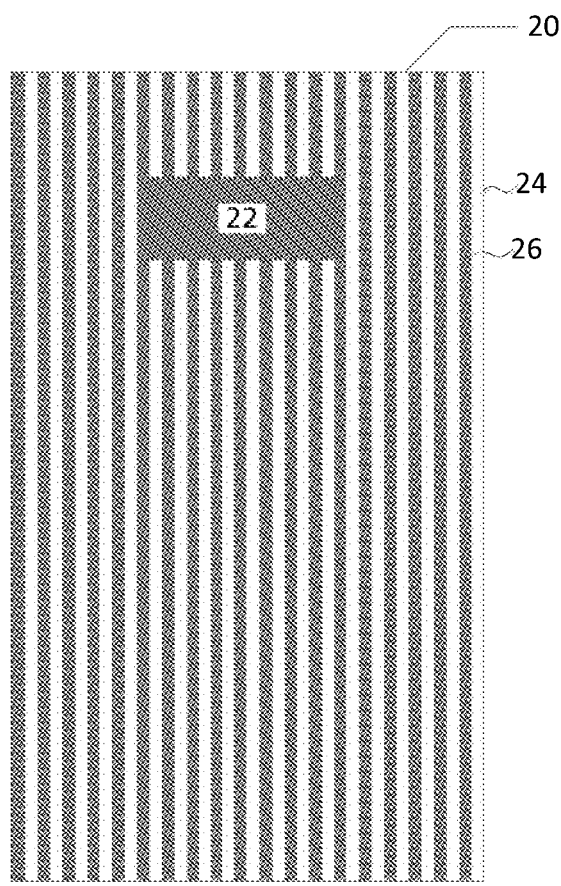
FIG. 3 is a schematic structural diagram of a second mask in an embodiment of the present invention.

As shown in FIG. 2 and FIG. 3, the present invention provides a mask assembly comprising a first mask 10 and a second mask 20, the first mask 10 and the second mask 20 having a same shape and size.

In the present embodiment, as shown in FIG. 2, the first mask 10 includes a plurality of first light shielding regions 14, a plurality of first light transmissive regions 16, and at least one first light shielding island 12. The plurality of first light shielding regions 14 and the first light transmissive regions 16 are parallel to each other and spaced from one another on the first mask 10. The first light shielding island 12 covers a portion of the first shielding regions and the first light transmissive regions 16. a boundary of the first light shielding island 12 is not connected to a boundary of the first mask 10.

In the present embodiment, as shown in FIG. 2, the second mask 20 includes a plurality of second light shielding regions 26, a plurality of second light transmissive regions 24, and at least one second light shielding island 22. The plurality of second light shielding island 26 and the second light transmissive regions 24 are parallel to each other and spaced from one another on the first mask 10. The second light shielding region 22 covers a portion of the second shielding regions 26 and the second light transmissive regions 24. A boundary of the second light shielding island 22 is not connected to a boundary of the second mask 20.

The first light shielding regions 14 and the second light shielding regions 26 are complementarily arranged, the first light transmissive regions 16 and the second light transmissive regions 24 are complementarily disposed. This means an arrangement of the first light shielding regions 14 and an arrangement of the second light transmissive regions 24 are same, and an arrangement of the first light transmissive regions 16 and an arrangement of the second light shielding regions 26 are same. A the first light shielding island and the second light shielding island have a same shape, size, and position, and are disposed to overlap each other.

In the present embodiment, an area of the first light shielding island and the second light shielding island is not smaller than 100 times an area of any one of the plurality of first light shielding regions 14, the plurality of first light transmissive regions 16, and the plurality of second light shielding regions 26 and the plurality of second light transmissive regions 24. Specifically, an area of the first light shielding island and the second light shielding island is not smaller than 0.5 cm$^2$. The shapes of the first light shielding island and the second light shielding island include, but are not limited to, a circle, an ellipse, a triangle, a rectangle, a polygon, and a heart.

In the present embodiment, the first mask 10 and the second mask 20 are rectangular, the first light shielding regions 14, the first light transmissive regions 16, the second light shielding regions 26 and the second light transmissive regions 24 are strip patterns parallel to one side of the first mask 10 and the second mask 20, a width of the strip patterns is smaller than or equal to 5 μm. Wherein, the first mask 10 and the second mask 20 are rectangular, the first light shielding regions 14, the first light transmissive regions 16, the second light shielding regions 26 and the second light transmissive regions 24 are strip patterns parallel to one side of the first mask 10 and the second mask 20, the strips have a same shape and size. Positions of the first light shielding regions 14 overlap with positions of the second light transmissive regions 24, and positions of the second light shielding regions 26 overlap with positions of the first light transmissive regions 16.

Accordingly, the present invention also provides a method of patterning a semiconductor film using a mask assembly, wherein the mask assembly comprising a first mask 10 and a second mask 20, the first mask 10 and the second mask 20 having a same shape and size. The method includes steps of:

First, transferring a pattern of the first mask 10 onto the semiconductor film. Wherein, the first mask 10 includes a plurality of first light shielding regions 14, a plurality of first light transmissive regions 16, and at least one first light shielding island 12; the plurality of first light shielding regions 14 and the first light transmissive regions 16 are parallel to each other and spaced from one another on the first mask 10; the first light shielding island 12 covers a portion of the first shielding regions and the first light transmissive regions 16. A boundary of the first light shielding island 12 is not connected to a boundary of the first mask 10.

Thereafter, transferring a pattern of the second mask 20 onto the semiconductor film. Wherein, the second mask 20 includes a plurality of second light shielding regions 26, a plurality of second light transmissive regions 24, and at least one second light shielding island 22; the plurality of second light shielding regions 26 and the second light transmissive regions 24 are parallel to each other and spaced from one another on the first mask 10; the second light shielding island 22 covers a portion of the second light shielding regions 26 and the second light transmissive regions 24. A boundary of the second light shielding island 22 is not connected to a boundary of the second mask 20.

Of course, it is also possible to transfer the pattern on the second mask 20 onto the semiconductor film, and then transfer the pattern on the first mask 10 onto the semiconductor film. Both of them can form shielding of the "Mediterranean" non-display regions.

The first light shielding regions 14 and the second light shielding regions 26 are complementarily arranged, the first light transmissive regions 16 and the second light transmissive regions 24 are complementarily disposed. The first light shielding island and the second light shielding island have a same shape, size, and position, and are disposed to overlap each other.

In the present embodiment, an area of the first light shielding island and the second light shielding island is not smaller than 100 times an area of any one of the plurality of first light shielding regions 14, the plurality of first light transmissive regions 16, and the plurality of second light shielding regions 26 and the plurality of second light transmissive regions 24. Specifically, an area of the first light shielding island and the second light shielding island is not smaller than 0.5 cm$^2$. The shapes of the first light shielding island and the second light shielding island include, but are not limited to, a circle, an ellipse, a triangle, a rectangle, a polygon, and a heart.

In the present embodiment, the first mask 10 and the second mask 20 are rectangular, the first light shielding regions 14, the first light transmissive regions 16, the second light shielding regions 26 and the second light transmissive regions 24 are strip patterns parallel to one side of the first mask 10 and the second mask 20, a width of the strip patterns is smaller than or equal to 5 μm. Wherein, the first mask 10 and the second mask 20 are rectangular, the first light shielding regions 14, the first light transmissive regions 16, the second light shielding regions 26 and the second light transmissive regions 24 are strip patterns parallel to one side of the first mask 10 and the second mask 20, the strips have a same shape and size. The positions of the first light shielding regions 14 overlap with the positions of the second light transmissive regions 24, the positions of the second light shielding regions 26 overlap with the positions of the first light transmissive regions 16.

In the mask assembly provided by the present invention, an overall evaporation of an OLED display region can be achieved by a complementary arrangement of the light shielding regions and the light transmissive regions, shielding of the "Mediterranean" non-display region can be achieved by overlapping the light shielding islands, thereby laser cutting of the display region is avoided. Since the width of the light shielding regions and the light transmissive regions are smaller than or equal to 5 μm, the height differences of the patterns formed by the two photoetchings can be substantially eliminated. At the same time as the formation of the "Mediterranean" non-display region, the formation of uneven evaporation patterns in the display region is avoided.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:

1. A mask assembly comprising a first mask and a second mask, the first mask and the second mask having a same shape and size, wherein
the first mask comprises a plurality of first light shielding regions, a plurality of first light transmissive regions, and at least one first light shielding island; the first light shielding regions and the first light transmissive regions are parallel to each other and spaced from one another on the first mask; the first light shielding island covers a portion of the first light shielding regions and the first light transmissive regions; and a boundary of the first light shielding island is not connected to a boundary of the first mask;
the second mask comprises a plurality of second light shielding regions, a plurality of second light transmissive regions, and at least one second light shielding island; the second light shielding regions and the second light transmissive regions are parallel to each other and spaced from one another on the second mask; the second light shielding island covers a portion of the second light shielding regions and the second light transmissive regions; and a boundary of the second light shielding island is not connected to a boundary of the second mask; wherein
the first light shielding regions and the second light shielding regions are complementarily arranged, the first light transmissive regions and the second light transmissive regions are complementarily disposed; and the first light shielding island and the second light shielding island have a same shape, size, and position and are disposed to overlap each other; and
the first mask and the second mask are rectangular, and the first light shielding regions, the first light transmissive regions, the second light shielding regions, and the second light transmissive regions are strip patterns parallel to one side of the first mask and the second mask; the strip patterns have a same shape and size, a position of the first light shielding regions coincides with a position of the second light transmissive regions, and a position of the second light shielding regions coincides with a position of the first light transmissive regions.

2. The mask assembly according to claim 1, wherein
the shape of the first light shielding island and the second light shielding island comprises a circle, an ellipse, a triangle, a rectangle, a polygon, and a heart.

3. The mask assembly according to claim 1, wherein
the first mask and the second mask are strip-shaped equidistant patterns, and the strip patterns of the first light shielding regions, the first light transmissive regions, the second light shielding regions, and the second light transmissive regions are parallel to an axis of symmetry of the first mask and the second mask.

4. The mask assembly according to claim 3, wherein a width of the strip patterns is smaller than or equal to 5 μm.

5. A mask assembly comprising a first mask and a second mask, the first mask and the second mask having a same shape and size, wherein
the first mask comprises a plurality of first light shielding regions, a plurality of first light transmissive regions, and at least one first light shielding island; the first light shielding regions and the first light transmissive regions are parallel to each other and spaced from one another on the first mask; the first light shielding island covers a portion of the first light shielding regions and the first light transmissive regions; and a boundary of the first light shielding island is not connected to a boundary of the first mask;
the second mask comprises a plurality of second light shielding regions, a plurality of second light transmissive regions, and at least one second light shielding island; the second light shielding regions and the second light transmissive regions are parallel to each other and spaced from one another on the second mask; the second light shielding island covers a portion of the second light shielding regions and the second light transmissive regions; and a boundary of the second light shielding island is not connected to a boundary of the second mask; wherein
the first light shielding regions and the second light shielding regions are complementarily arranged, the first light transmissive regions and the second light transmissive regions are complementarily disposed; and the first light shielding island and the second light shielding island have a same shape, size, and position and are disposed to overlap each other.

6. The mask assembly according to claim 5, wherein
the shape of the first light shielding island and the second light shielding island comprises a circle, an ellipse, a triangle, a rectangle, a polygon, and a heart.

7. The mask assembly according to claim 6, wherein
the first mask and the second mask are strip-shaped equidistant patterns, and the first light shielding regions, the first light transmissive regions, the second light shielding regions, and the second light transmissive regions are strip patterns parallel to an axis of symmetry of the first mask and the second mask.

8. The mask assembly according to claim 7, wherein a width of the strip patterns is smaller than or equal to 5 μm.

9. A method of patterning a semiconductor film using a mask assembly, wherein the mask assembly comprises a first mask and a second mask, and the first mask and the second mask have a same shape and size; the method comprising steps of:
transferring a pattern of the first mask onto the semiconductor film, wherein the first mask comprises a plurality of first light shielding regions, a plurality of first light transmissive regions, and at least one first light shielding island; the first light shielding regions and the first light transmissive regions are parallel to each other and spaced from one another on the first mask; the first light shielding island covers a portion of the first light shielding regions and the first light transmissive regions; and a boundary of the first light shielding island is not connected to a boundary of the first mask; and transferring a pattern of the second mask onto the semiconductor film, wherein the second mask comprises a plurality of second light shielding regions, a plurality of second light transmissive regions, and at least one second light shielding island; the second light shielding regions and the second light transmissive regions are parallel to each other and spaced from one another on the first mask; the second light shielding island covers a portion of the second light shielding regions and the second light transmissive regions; and a boundary of the second light shielding island is not connected to a boundary of the second mask; wherein the first light shielding regions and the second light shielding regions are complementarily arranged, the first light transmissive regions and the second light transmissive regions are complementarily disposed; and the first light shielding island and the second light shielding island have a same shape, size, and position and are disposed to overlap each other.

10. The method of patterning the semiconductor film using the mask assembly according to claim 9, wherein the shape of the first light shielding island and the second light shielding island comprises a circle, an ellipse, a triangle, a rectangle, a polygon, and a heart.

11. The method of patterning the semiconductor film using the mask assembly according to claim 10, wherein the first mask and the second mask are strip-shaped equidistant patterns, and the first light shielding regions, the first light transmissive regions, the second light shielding regions, and the second light transmissive regions are strip patterns parallel to an axis of symmetry of the first mask and the second mask.

12. The method of patterning the semiconductor film using the mask assembly according to claim 11, wherein a width of the strip patterns is smaller than or equal to 5 µm.

13. The method of patterning the semiconductor film using the mask assembly according to claim 9, wherein the first mask and the second mask are rectangular, and the first light shielding regions, the first light transmissive regions, the second light shielding regions, and the second light transmissive regions are strip patterns parallel to one side of the first mask and the second mask; the strip patterns have a same shape and size, a position of the first light shielding regions coincides with a position of the second light transmissive regions, and a position of the second light shielding regions coincides with a position of the first light transmissive regions.

* * * * *